United States Patent [19]
Kim

[11] Patent Number: 6,080,616
[45] Date of Patent: Jun. 27, 2000

[54] METHODS OF FABRICATING MEMORY CELLS WITH REDUCED AREA CAPACITOR INTERCONNECT

[75] Inventor: Yun-gi Kim, Kangwon-do, Rep. of Korea

[73] Assignee: Samsung Electronics Co., Ltd., Rep. of Korea

[21] Appl. No.: 09/025,905

[22] Filed: Feb. 19, 1998

Related U.S. Application Data

[62] Division of application No. 08/803,285, Feb. 20, 1997, Pat. No. 5,796,134.

[30]   Foreign Application Priority Data

Feb. 21, 1996 [KR]   Rep. of Korea ........................ 96-4067

[51] Int. Cl.[7] ........................... H01L 21/76; H01L 21/44; H01L 27/108; H01L 29/78
[52] U.S. Cl. ........................ 438/239; 438/454; 438/653; 438/656; 438/666; 438/685; 257/295; 257/296
[58] Field of Search ................................ 438/239, 454, 438/653, 656, 666, 685; 257/295, 296

[56]        References Cited

U.S. PATENT DOCUMENTS

| | | | |
|---|---|---|---|
| 5,369,296 | 11/1994 | Kato ........................................ | 257/295 |
| 5,578,867 | 11/1996 | Argos ...................................... | 257/632 |
| 5,719,416 | 2/1998 | Yoshimori ............................... | 257/295 |
| 5,866,926 | 2/1999 | Takenaka ................................ | 257/295 |

FOREIGN PATENT DOCUMENTS

| | | |
|---|---|---|
| 63-16657 | 1/1988 | Japan . |
| 5-21808 | 1/1993 | Japan . |

*Primary Examiner*—Charles Bowers
*Assistant Examiner*—Nema Berezny
*Attorney, Agent, or Firm*—Myers Bigel Siblay & Sajovec

[57]        ABSTRACT

A memory cell is formed including an insulation region on the substrate and a transistor including a gate on the substrate and a source/drain region in the substrate disposed between the gate and the insulation region. The cell also includes a capacitor including an electrode overlying the insulation region, the electrode having a lateral surface adjacent the source/drain region. A conductive interconnecting region is formed on the substrate and extends from the source/drain region to contact the lateral surface of the first electrode of the capacitor. The capacitor may include a first electrode on the insulation region, a dielectric region on the first electrode, and a second electrode on the dielectric region. The first electrode preferably is platinum and the dielectric region preferably is a ferroelectric material such as lead zirconate titanate (PZT) or $Ba_xSr_{1-x}TiO_3$ (BST). The first electrode preferably has a lateral surface, and the conductive interconnecting region extends to contact the lateral surface of the first electrode. The first electrode preferably has a top surface adjacent the lateral surface, and the cell preferably further comprises an insulation region on the top surface of the first electrode which laterally separates the dielectric region and the second electrode from the conductive interconnecting region.

20 Claims, 3 Drawing Sheets

METHODS OF FABRICATING MEMORY CELLS WITH REDUCED AREA CAPACITOR INTERCONNECT

This is a divisional of application Ser. No. 08/803,285 filed Feb. 20, 1997, now U.S. Pat. No. 5,796,134.

FIELD OF THE INVENTION

The present invention relates microelectronic devices and methods of fabrication therefor, more particularly, to memory devices and methods of fabrication therefor.

BACKGROUND OF THE INVENTION

Ferroelectric memory devices have been proposed as alternatives to conventional memory devices. Ferroelectric memory devices utilize the spontaneous polarization properties of ferroelectric films to provide data storage elements which offer relatively fast read/write operations compared with conventional storage elements. In addition, using a capacitor having a ferroelectric dielectric as a data storage device for a memory cell can reduce the power consumption of the memory cell and increase operational speed as refresh operations typically are not required to maintain data in the capacitor. Moreover, such a ferroelectric random access memory (FRAM) device may operate from a single power supply voltage.

Generally, two types of FRAM cells are conventionally used: (1) a transistor employing a ferroelectric film as a gate insulation film, and (2) an access transistor connected to a cell capacitor employing a ferroelectric film as a dielectric. Fabrication difficulties associated with the first type of cell include the potential formation of a silicon oxide film by reaction of silicon with oxygen atoms at the interface between the silicon channel region of the transistor and the ferroelectric gate insulation film. In addition, it may be difficult to form a high-quality ferroelectric film due to a lattice constant difference or thermal expansion coefficient difference between the silicon substrate and ferroelectric film.

For these reasons, conventional FRAM devices tend to employ the second structure described above. Lead zirconate titanate (PZT or $PbZr_xTi_{1-x}O_3$) is typically used for the dielectric of the capacitor. According to a typical fabrication process, PZT is deposited by sol-gel coating a metal electrode and then annealing the coating in an oxygen atmosphere at a temperature ranging from 500~650° C., thereby forming a PZT layer on the electrode having an appropriate polarization characteristic. The annealing temperature of 500° C. to 650° C. may deform a conventional aluminum electrode, while using a tungsten electrode may reduce the dielectric ratio of the capacitor and the conductivity of the electrode due to oxidation of tungsten during the annealing of the PZT dielectric. Therefore, the PZT dielectric typically is formed on an electrode formed of a material, for example, platinum, having an oxidation resistance and a high melting point to obtain superior characteristics as a capacitor.

FIGS. 1 and 2 illustrate a conventional FRAM cell layout. Referring to FIG. 1, the conventional cell layout includes an active region 112 generally disposed along a direction x, and first and second word lines 130a, 130b disposed in parallel along a direction y transverse to the active region 112. The first and second word lines 130a, 130b divide the active region 112 into three sections, including a first source/drain region 118 adjacent the first word line 130a, a second source/drain region 117 positioned between the first and second word lines 130a, 130b, and a third source/drain region 116 adjacent the second word line 130b. A pair of lower electrodes 122a, 122b are disposed adjacent to the first and third source/drain regions 118, 116. A pair of upper electrodes 126a, 126b are disposed on an area of the respective lower electrodes 122a, 122b. First contact holes 112a, 112b expose predetermined areas of the respective first and third source/drain regions 118, 116. Second contact holes 132a, 132b expose a predetermined area of the lower electrodes 122a, 122b, and are adjacent respective upper electrodes 126a, 126b. A first interconnection 123a connects the first source/drain region 118 to the lower electrode 122a through the first and second contact holes 112a, 132a. A second interconnection 123b connects the third source/drain region 116 to the lower electrode 122b through the first and second contact holes 112b, 132b. A third contact hole 140a exposes an area of the second source/drain region 117, with a bit line 140 being connected to the second source/drain region 117 through the third contact hole 140a. Fourth contact holes 150a, 150b expose the upper electrodes 126a, 126b, with a first upper electrode line 150a connecting to the upper electrode 126a through the fourth contact hole 150a, and a second upper electrode line 155b connecting to the upper electrode 126b through the fourth contact hole 150b.

Referring to FIG. 2, the conventional FRAM includes a semiconductor substrate 116 having an active region and a nonactive region defined thereon by a field oxide layer 114. The first word line 130a is formed on a predetermined area of the active region and functions as a gate electrode. The first source/drain region 118 and the second source/drain region 117 are formed in the substrate 116 on opposite sides of the first word line 130a. A first interlayer insulation layer 500 is formed over the first source/drain region 118, the second source/drain region 117 and the first word line 130a. A capacitor including a lower electrode 122a, a ferroelectric film 124, and the upper electrode 126a, is formed on an area of the first interlayer insulation layer 500. Typically, the lower electrode 122a is platinum, and the ferroelectric film 124 is PZT.

A second interlayer insulation layer 600 is formed on the capacitor and first interlayer insulation layer 500, partially exposing the lower electrode 122a and the upper electrode 126a. A first interconnection 123a is formed on a predetermined area of the second interlayer insulation layer 600 and is electrically connected to the lower electrode 122a through the contact hole 132a and to the first source/drain region 118 through the contact hole 112a. A bit line 140 is connected to the second source/drain region 117 through the contact hole 140a. A third interlayer insulation layer 700 is formed covering the bit line 140 and the first interconnection 123a. A first upper electrode line 155a is connected to the upper electrode 126a through the contact hole 150a.

For the conventional FRAM cell illustrated, directly connecting the platinum lower electrode 122a to the silicon first source/drain region 118 may cause the electrode to lose conductivity or cause substitution of silicon in the substrate. To prevent this, the first source/drain region 118 and the lower electrode 122a are connected via the first interconnection 123a. However, it is difficult to reduce cell area using such a structure, generally making such an interconnection structure unsuitable for forming highly-integrated FRAM devices.

SUMMARY OF THE INVENTION

In light of the foregoing, it is an object of the present invention to provide memory cells and fabrication methods therefor which have a reduced-area interconnection between the cell's ferroelectric storage capacitor and the cell transistor.

This and other objects, features and advantages are provided according to the present invention by memory cells and fabrication techniques therefor in which a transistor is formed at an active region of a substrate adjacent an insulation region, a capacitor, preferably ferroelectric, is formed on the insulation, and a conductive interconnecting region is formed on the substrate extending from the source/drain region to contact a lateral surface of the capacitor electrode adjacent the source/drain region. The conductive interconnecting region preferably is formed by etching an insulation region covering the source drain region using the capacitor electrode as an etching mask. The capacitor electrode preferably is platinum and the conductive interconnecting region preferably includes a titanium/titanium nitride (Ti/TiN) barrier layer which conformally contacts the source/drain region and the lateral surface of the capacitor electrode and an aluminum conductive region which contacts the barrier layer opposite the source/drain region and the lateral surface of the capacitor electrode. Preferably, the capacitor includes a first electrode formed on the insulation region, a dielectric region, preferably ferroelectric, formed on the first electrode, and a second electrode formed on the dielectric region. A second insulation region may be formed which separates the dielectric region and the second electrode from the conductive interconnecting region.

By forming an interconnect between the capacitor electrode and the source/drain region, the present invention can reduce the problems associated with forming a platinum electrode directly on a silicon surface. Using the differential etching properties of the capacitor electrode and the insulation region, an interconnect which extends directly from the source/drain region to the lateral surface of the electrode can be formed, allowing the capacitor to be placed close to the transistor. The reduced area of the interconnection can reduce cell area and increase potential integration density.

In particular, according to the present invention, a memory cell includes a substrate, and an insulation region on the substrate, and a transistor including a gate on the substrate and a source/drain region in the substrate disposed between the gate and the insulation region. The cell also includes a capacitor including an electrode overlying the insulation region, the electrode having a lateral surface adjacent the source/drain region. A conductive interconnecting region on the substrate extends from the source/drain region to contact the lateral surface of the first electrode of the capacitor. The capacitor preferably includes a first electrode on the insulation region, a dielectric region on the first electrode, and a second electrode on the dielectric region. The first electrode preferably is platinum and the dielectric region preferably is a ferroelectric material such as lead zirconate titanate (PZT) or $Ba_xSr_{1-x}TiO_3$ (BST). The first electrode preferably has a lateral surface, and the conductive interconnecting region extends to contact the lateral surface of the first electrode. The first electrode preferably has a top surface adjacent the lateral surface, and the cell preferably further comprises an insulation region on the top surface of the first electrode which laterally separates the dielectric region and the second electrode from the conductive interconnecting region.

The conductive interconnecting region may include a barrier layer conformally covering the source/drain region and the lateral surface of the first electrode of the capacitor, and a conductive region contacting the barrier layer opposite the source/drain region and the lateral surface of the first electrode of the capacitor. The barrier layer may include a titanium layer covering a portion of the source/drain region and a titanium nitride layer covering the titanium layer and the lateral surface of the first electrode of the capacitor. The conductive region may be one of aluminum and tungsten.

According to fabrication method aspects, a memory cell is formed on a substrate by forming a field insulation region on a portion of the substrate, defining an active region adjacent thereto. A transistor is formed at the active region, the transistor including a gate on the substrate and a source/drain region in the substrate disposed between the gate and the field insulation region. A capacitor is formed on the field insulation region, the capacitor including an electrode having a lateral surface adjacent the source/drain region. A conductive interconnecting region is formed on the substrate, the conductive interconnecting region extending from the source/drain region to contact the lateral surface of the electrode of the capacitor.

The capacitor preferably is formed by forming a first insulation layer on the substrate, preferably by chemical vapor deposition of silicon dioxide, which covers the field insulation region and the source/drain region. A first electrode, preferably platinum, is then formed on the first insulation layer, a dielectric region, preferably a ferroelectric material such as PZT or BST, is formed on the first electrode, and a second electrode is formed on the dielectric region. The first electrode preferably has a lateral surface adjacent the source/drain region, and the conductive interconnecting region is formed which extends from the source/drain region to contact the lateral surface of the first electrode.

An insulation region may be formed which separates the dielectric region and the second electrode from the conductive interconnecting region. The insulation region may be formed by forming a second insulation layer covering the first insulation layer and the capacitor and removing portions of the second insulation layer and the first insulation layer overlying the source/drain region to expose a lateral surface of the first electrode and a portion of the source/drain region and to leave a portion of the first insulation layer overlying the field insulation region. The second insulation layer is preferably formed by electron cyclotron resonance (ECR) chemical vapor depositing (CVD) silicon dioxide.

The conductive interconnecting region may be formed by forming a barrier layer conformally covering the exposed portion of the source/drain region and the exposed lateral surface the first electrode, and forming a conductive region contacting the barrier layer opposite the source/drain region and the lateral surface of the first electrode. The barrier layer may be formed by forming a titanium layer conformally covering the exposed portion of the source/drain region, and forming a titanium nitride layer covering the titanium layer and the exposed lateral surface of the first electrode. The conductive region may include one of aluminum and tungsten.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
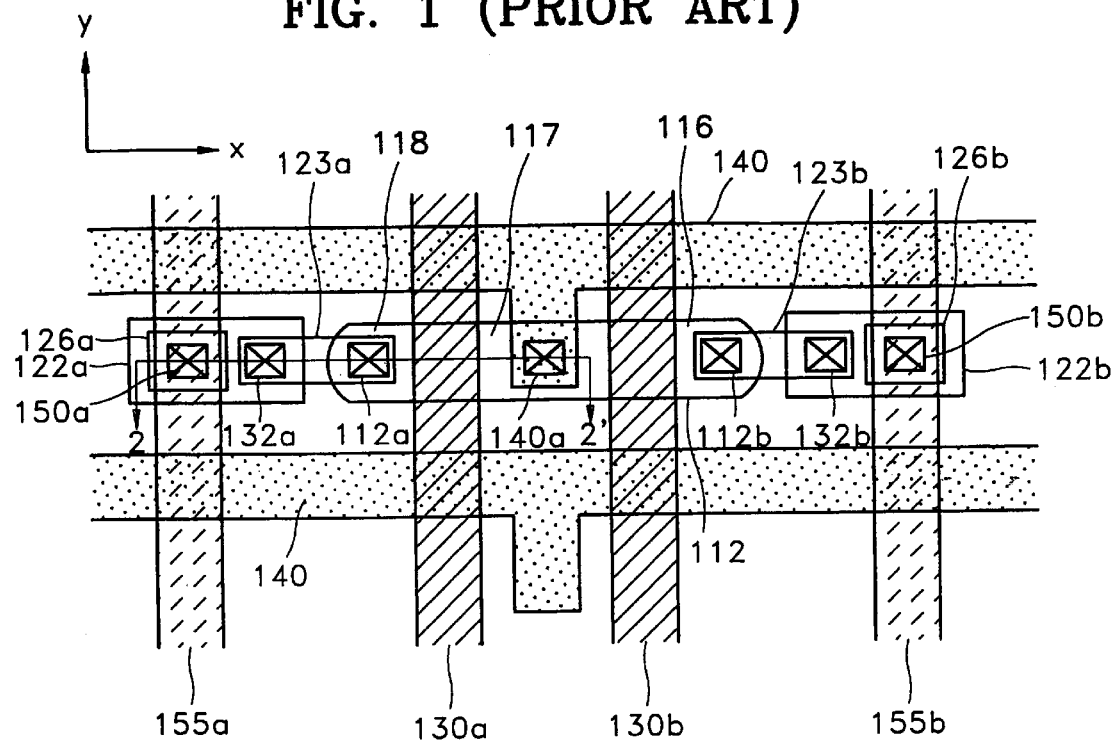
FIG. 1 is a plan view illustrating a ferroelectric random access memory (FRAM) device according to the prior art.
Figure 2:
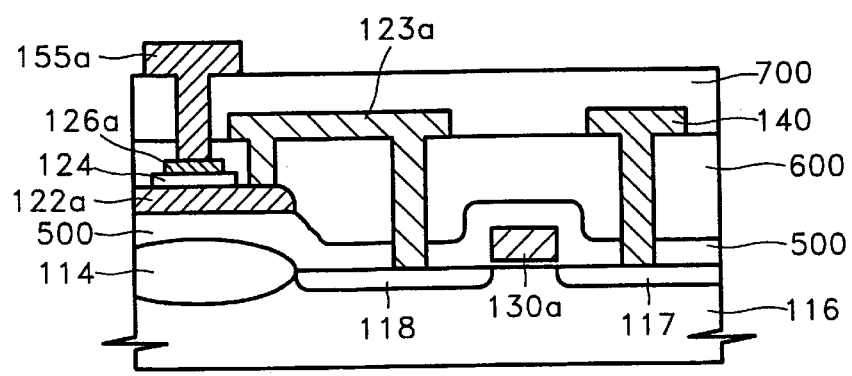
FIG. 2 is a cross-sectional view of the conventional FRAM device of FIG. 1 along the line 2–2'.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout. Those skilled in the art will appreciate that the term "source/drain" region refers to a region of a microelectronic device which may serve as either a source or a drain depending on circuit configuration, and that each embodiment described and illustrated herein includes complementary embodiments in which a source/drain region serves as a source or as a drain.

Figure 3:
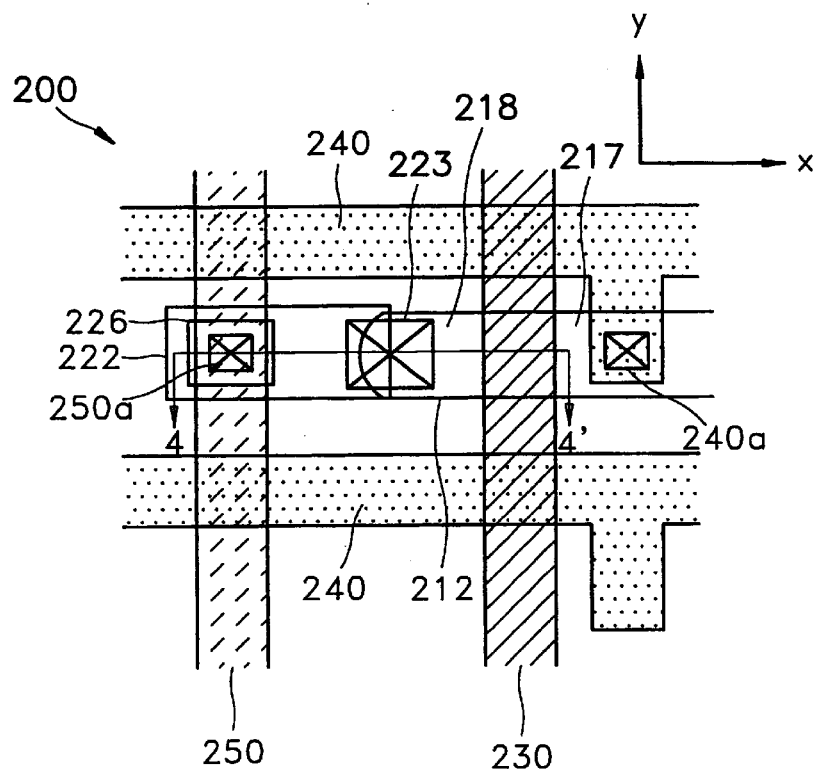
FIG. 3 is a plan view of an embodiment of a memory device according to the present invention.

Referring to FIG. 3, a unit cell 200 of a memory device according to the present invention includes an active region 212 disposed along a direction x and a word line 230 disposed along a direction y transverse to the active region 212. The word line 230 divides the active region 212 into two sections, a first source/drain region 218 and a second source/drain region 217. The unit cell 200 also includes a first electrode 222 disposed adjacent to the first source/drain region 218, a second electrode 226 disposed above the first electrode 222, and a contact hole 223 which exposes portions of the first source/drain region 218 and the first electrode 222. A contact hole 240a exposes an portion of the second source/drain region 217, with a bit line 240 being connected to the second source/drain region 217 through the contact hole 240a. A contact hole 250a exposes a portion of a second electrode 226, with an upper electrode line 250 being connected to the second electrode 226 through the contact hole 250a.

Figure 4:
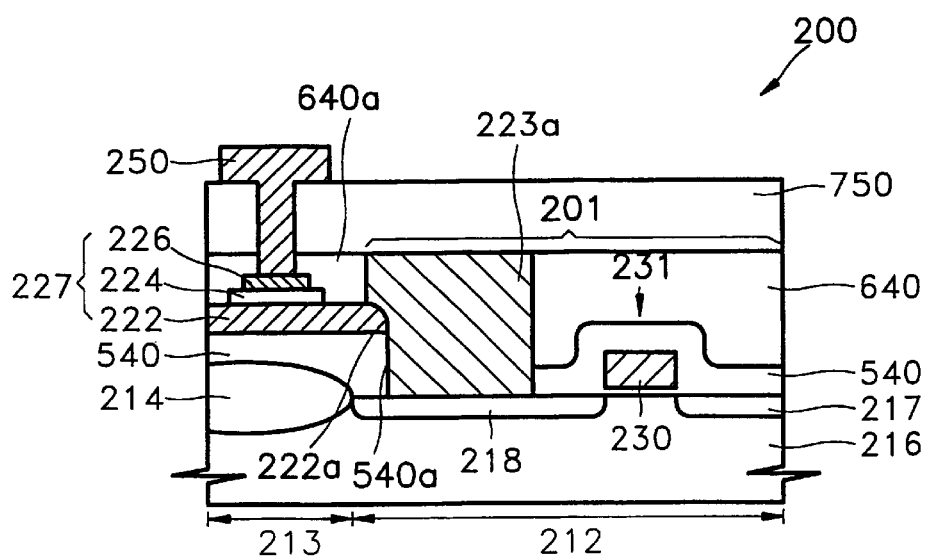
FIG. 4 is a cross-sectional view illustrating the memory device of FIG. 3 along a line 4–4'.

FIG. 4 is a cross-sectional view of the unit cell 200 of FIG. 3 along the line 4–4' of FIG. 3. The unit cell 200 includes a substrate 216, such as silicon, having an active region 212 and a nonactive region 213 defined by a field insulation region 214, e.g., a field oxide film, formed on the substrate 216. The word line 230 serves as a gate electrode of gate 231 of a transistor 201 formed at the active region 212 which includes a first source/drain region 218 and a second source/drain region 217 on opposite sides of the gate 231. A first insulation layer 540 covers the field insulation region 214, the gate 231, and the first and second source/drain regions 218, 217. A capacitor 227 is formed on the first insulation layer 540, overlying the field insulation region 214, and includes a first electrode 222, preferably platinum, formed on the first insulation layer 540, a dielectric region 224, preferably ferroelectric PZT, formed on the first electrode 222, and a second electrode 226 formed on the dielectric region 224. A conductive interconnecting region 223a extends from the first source/drain region 218 in a direction substantially perpendicular to the surface of the substrate 216 to contact a lateral surface 222a of the first electrode 222. Those skilled in the art will appreciate that in order to achieve tight spacing between the capacitor 227 and the transistor 201, the interface between the conductive interconnecting region 223a and the lateral surface 540a of the first insulation layer 540 and the lateral surface 222a of the electrode 222 preferably approaches perpendicularity, but that interfaces which deviate from true perpendicularity fall within the scope of the present invention. It will also be understood that the conductive interconnecting region 223a may extent to overlie a portion of the top surface of the electrode 222.

A second insulation layer 640 includes an insulation region 640a which separates the dielectric region 224 and the second electrode 226 from the conductive interconnecting region 223a. A third insulation layer 750 lies on the second insulation layer 640. An electrode line 250 is formed on the third insulation layer 750, passing through the third insulation layer 750 and the second insulation layer 640 to contact the second electrode 226. The first electrode 222 preferably is a platinum film having a melting point of higher than 900° C. and a high oxidation resistance. The dielectric region 224 preferably is a ferroelectric film formed of PZT or BST ($Ba_xSr_{1-x}TiO_3$). The conductive interconnecting region 223a may include a titanium/titanium nitride barrier layer which contacts the lateral surface 222a of the first electrode 222 and the source/drain region 218, and an aluminum or tungsten region which contacts the barrier layer opposite the first electrode 222 and the first source/drain region 218.

Figure 5A:
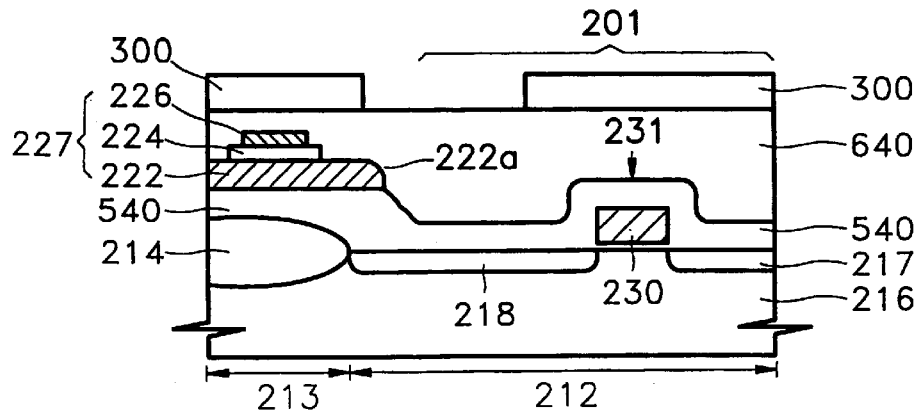
FIGS. 5A–5C are cross-sectional views of intermediate fabrication products illustrating operations for forming a memory cell according to the present invention.
Figure 5B:
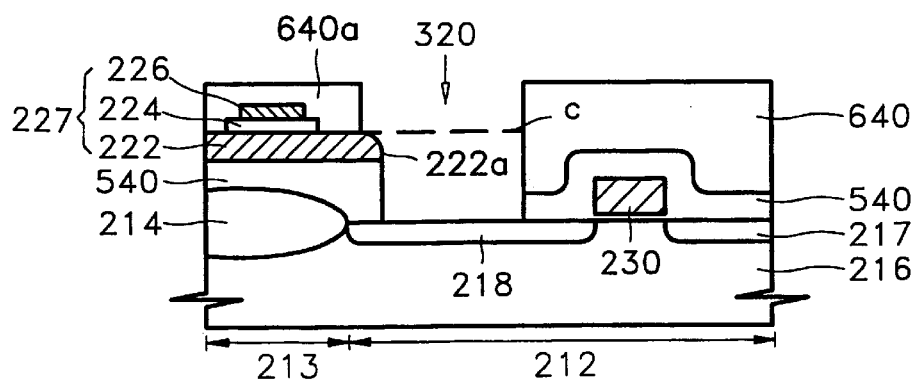
Figure 5C:
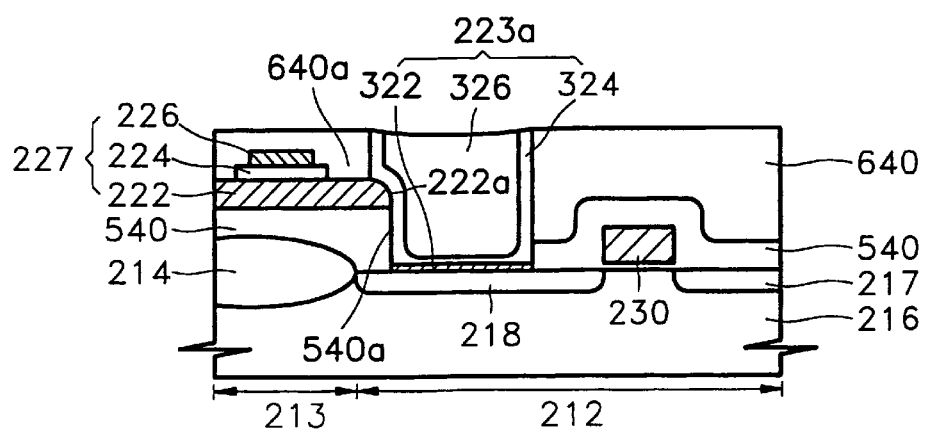

Operations for forming a unit cell according to the present invention are illustrated in FIGS. 5A–5C. Referring to FIG. 5A, a field insulation region 214, e.g., a field oxide, is formed on a substrate 216 to define an active region 212 and a nonactive region 213. Next, a transistor 201 is formed at the active region 212, including a gate 231 including a gate electrode 230 and first and second source/drain regions 218, 217 formed on opposite sides of the gate 231. Those skilled in the art will appreciate that the transistor 201 may be formed in a variety of ways using conventional techniques which need not be discussed in greater detail herein.

A first insulation layer 540, preferably a silicon dioxide film formed using a chemical vapor deposition (CVD) process, is formed covering the gate 231, the first and second source/drain regions 218, 217 and the field insulation region 214. A capacitor 227 is then formed on the first insulation layer 540 by sequentially forming a first electrode 222, a dielectric region 224, and a second electrode 226. The first electrode 222 preferably is platinum, while the dielectric region 224 preferably is formed of a ferroelectric material such as PZT or BST. The first electrode 222 preferably is formed adjacent the first source/drain region 218, and has a lateral surface 222a adjacent the first source/drain region 218. The dielectric region 224 and the second electrode 226 are preferably formed such that a portion of the first electrode 222 extends past the dielectric region 224 and the second electrode 226.

A second insulation layer 640 is formed, covering the capacitor 227, and the first insulation layer 540. Preferably, the second insulation layer is formed of silicon dioxide obtained by an electron cyclotron resonance (ECR) CVD process. The use of the ECR CVD process allows the second insulation layer 640 to have a lower hydrogen content than silicon dioxide films formed by conventional CVD processes, as the ECR CVD process typically is performed at lower temperature, e.g., less than 450° C. The lower hydrogen content of the second insulation layer 640 can help prevent degradation of the electrical characteristics of a ferroelectric PZT dielectric region 224 arising from ionization of hydrogen atoms ($H^+$) during subsequent thermal treatment at temperatures over 400° C. A photoresist pattern 300 is then formed on the second insulation layer 640, leaving exposed a portion of the second insulation layer 640 overlying the first source/drain region 218 and the first electrode 222.

Referring to FIG. 5B, the second insulation layer 640 and the first insulation layer 540 are then etched using the photoresist pattern 300 as an etching mask, thereby forming a contact hole 320 which exposes the lateral surface 222a of the first electrode 222 and a portion of the first source/drain region 218, and leaves an insulation region 640a between the contact hole 320 and the dielectric region 224. If, as is preferred, the first electrode 222 is formed of platinum while the first and second insulation layers 540, 640 are formed of silicon dioxide, the etching selectivity ratio of the platinum first electrode 222 to the silicon dioxide insulation layers 540, 640 may exceed 20:1. Thus, once exposed, the first electrode 222 may serve as an etching mask for etching portions of the first and second insulation layers 540, 640 below the top surface 222b of the first electrode 222 (a depth designated by "C" in FIG. 5B).

Referring to FIG. 5C, the photoresist pattern 300 is then removed, and a conductive interconnecting region 223a is formed in the contact hole 320. To form the conductive interconnecting region 223a, a barrier layer may be formed, including a titanium (Ti) layer 322 which conformally covers the exposed portion of the first source/drain region 218, and a titanium nitride (TiN) layer 324 which conformally covers the exposed lateral portion 222a of the first electrode 222 and contacts the titanium layer 322 opposite the first source/drain region 218. A conductive region 326, e.g., aluminum or tungsten, may then be formed contacting the barrier layer opposite the lateral surface 222a and the first source/drain region 218. Preferably, the conductive interconnecting region 223a is etched back until the second insulation layer 640 is exposed. The insulation region 640a separates the conductive interconnecting region 223a from the dielectric region 224 and the second electrode 226 of the capacitor 227.

Next, as best illustrated by FIG. 4, a third insulation layer 750 may then be formed on the second insulation layer, and then the third and second insulation layers 750, 640 may be selectively etched to form a contact hole exposing a portion of the second electrode 226. An electrode line 250 may then be formed on the third insulation layer 750, contacting the second electrode 226 through the contact hole.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a memory cell on a substrate, the method comprising the steps of:
   forming a field insulation region on a portion of the substrate, defining an active region adjacent thereto;
   forming a transistor in the active region, the transistor including a gate on the substrate and a source/drain region in the substrate disposed between the gate and the field insulation region;
   forming a capacitor on the field insulation region, the capacitor including an electrode having a lateral surface adjacent the source/drain region; and
   forming a conductive interconnecting region on the substrate, the conductive interconnecting region extending from the source/drain region to contact the lateral surface of the electrode of the capacitor.

2. A method according to claim 1, wherein said substrate has a surface, and wherein said step of forming a conductive interconnecting region comprises the step of forming a conductive interconnecting region which extends from the source/drain region in a direction substantially perpendicular to said substrate surface to contact the lateral surface of the electrode of the capacitor.

3. A method according to claim 1, wherein said step of forming a capacitor comprises the steps of:
   forming a first insulation layer on the substrate, covering the field insulation region and the source/drain region;
   forming a first electrode on the first insulation layer;
   forming a dielectric region on the first electrode; and
   forming a second electrode on the dielectric region.

4. A method according to claim 3, wherein said step of forming a first insulation layer comprises the step chemical vapor depositing (CVD) silicon dioxide.

5. A method according to claim 3:
   wherein said step of forming a first electrode comprises the step of forming a first electrode on the first insulation region, the first electrode having a lateral surface adjacent the source/drain region; and
   wherein said step of forming a conductive interconnecting region comprises the step of forming a conductive interconnecting region on the substrate, the conductive interconnecting region extending from the source/drain region to contact the lateral surface of the first electrode.

6. A method according to claim 5, wherein said first electrode comprises platinum, and wherein the dielectric region comprises a ferroelectric material.

7. A method according to claim 6, wherein the ferroelectric material comprises one of lead zirconate titanate (PZT) and $Ba_xSr_{1-x}TiO_3$ (BST).

8. A method according to claim 5, further comprising the step of forming an insulation region which separates the dielectric region and the second electrode from the conductive interconnecting region.

9. A method according to claim 8:
   wherein said step of forming an insulation region which separates the dielectric region and the second electrode from the conductive interconnecting region comprises the steps of:
      forming a second insulation layer covering the first insulation layer and the capacitor;
      removing portions of the second insulation layer and the first insulation layer overlying the source/drain region to expose a lateral surface of the first electrode and a portion of the source/drain region and to leave a portion of the first insulation layer overlying the field insulation region.

10. A method according to claim 9, wherein said step of forming a second insulation layer comprises the step of electron cyclotron resonance (ECR) chemical vapor depositing (CVD) silicon dioxide.

11. A method according to claim 10, wherein said step of forming a conductive interconnecting region comprises the steps of:
   forming a barrier layer conformally covering the exposed portion of the source/drain region and the exposed lateral surface the first electrode; and
   forming a conductive region contacting the barrier layer opposite-the source/drain region and the lateral surface of the first electrode.

12. A method according to claim 11, wherein the first electrode comprises platinum and wherein said step of forming a barrier layer comprises the steps of:
   forming a titanium layer conformally covering the exposed portion of the source/drain region; and forming a titanium nitride layer covering the titanium layer and the exposed lateral surface of the first electrode.

13. A method according to claim 12, wherein said conductive region comprises one of aluminum and tungsten.

14. A method of forming an interconnect between an active region of a substrate and an electrode overlying a field insulation region adjacent the active region, the electrode having a lateral surface adjacent the active region, the method comprising the steps of:

forming a conductive interconnecting region on the substrate which extends from the active region to contact the lateral surface of the electrode.

15. A method according to claim 14, wherein the substrate has a surface, and wherein said step of forming comprises the step of forming a conductive interconnecting region on the substrate which extends from the active region in a direction substantially perpendicular to said substrate surface to contact the lateral surface of the electrode.

16. A method according to claim 14, wherein the electrode comprises platinum and the active region comprises silicon.

17. A method according to claim 14, wherein the electrode comprises a top surface adjacent the lateral surface, and wherein said step of forming a conductive interconnecting region is preceded by the steps of:

forming an insulation region covering the active region, the lateral surface of the electrode, and a portion of the top surface of the electrode; and removing portions of the insulation region overlying the active region to expose a portion of the active region and the lateral surface of the electrode.

18. A method according to claim 17, wherein said step of forming a conductive interconnecting region comprises the steps of:

forming a barrier layer conformally covering the exposed portion of the active region and the exposed lateral surface of the electrode; and forming a conductive region contacting the barrier layer opposite the active region and the lateral surface of the electrode.

19. A method according to claim 17, wherein the electrode comprises platinum, wherein the active region comprises silicon, and wherein said step of forming a barrier layer comprises the steps of:

forming a titanium layer conformally covering the exposed portion of the active region; and forming a titanium nitride layer conformally covering the titanium layer and the exposed lateral surface of the electrode.

20. A method according to claim 19, wherein the conductive region comprises one of aluminum and tungsten.

* * * * *